United States Patent
Pelly et al.

(10) Patent No.: US 7,474,585 B2
(45) Date of Patent: **\*Jan. 6, 2009**

(54) MEMORY WITH SERIAL INPUT-OUTPUT TERMINALS FOR ADDRESS AND DATA AND METHOD THEREFOR

(75) Inventors: Perry H. Pelly, Austin, TX (US); Carlos A. Greaves, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/736,231

(22) Filed: Apr. 17, 2007

(65) Prior Publication Data

US 2007/0211554 A1    Sep. 13, 2007

Related U.S. Application Data

(62) Division of application No. 10/854,554, filed on May 26, 2004, now Pat. No. 7,221,613.

(51) Int. Cl.
*G11C 8/00* (2006.01)

(52) U.S. Cl. ............................ 365/230.03; 365/230.08; 365/233

(58) Field of Classification Search ............ 365/189.02, 365/189.05, 194, 221, 230.02, 230.03, 230.05, 365/230.08, 233, 226, 230.06, 240; 326/33; 327/41; 712/210; 713/400
See application file for complete search history.

(56) References Cited

U.S. PATENT DOCUMENTS

| | | | |
|---|---|---|---|
| 5,323,360 A * | 6/1994 | Pelley, III | ............ 365/230.03 |
| 5,343,428 A | 8/1994 | Pilo et al. | |
| 5,367,494 A | 11/1994 | Shebanow et al. | |
| 5,386,391 A | 1/1995 | Watanabe | |
| 5,418,920 A | 5/1995 | Kuddes | |
| 5,452,261 A | 9/1995 | Chung et al. | |
| 5,479,370 A | 12/1995 | Furuyama et al. | |

(Continued)

OTHER PUBLICATIONS

Bhyrav Mutnury, Moises Cases, Nam Pham, Daniel N. De Araujo, Erden Matoglu, Pravin Patel and Brad Hermann, Analysis of Fully Buffered DIMM Interface in High-speed Server Applications, 2006 Electronic Components and Technology Conference, p. 203-208.

(Continued)

*Primary Examiner*—Trong Phan
(74) *Attorney, Agent, or Firm*—Ranjeev Singh (57) ABSTRACT

A memory (10) has a plurality of memory cells, a serial address port (47) for receiving a low voltage high frequency differential address signal, and a serial input/output data port (52, 54) for receiving a high frequency low voltage differential data signal. The memory (10) can operate in one of two different modes, a normal mode and a cache line mode. In cache line mode, the memory can access an entire cache line from a single address. A fully hidden refresh mode allows for timely refresh operations while operating in cache line mode. Data is stored in the memory array (14) by interleaving in multiple sub-arrays (15, 17). During a hidden refresh mode of operation, one sub-array (15) is accessed while another sub-array (17) is refreshed. Two or more of the memories (10) may be chained together to provide a high speed low power memory system.

23 Claims, 3 Drawing Sheets

U.S. PATENT DOCUMENTS

| | | | |
|---|---|---|---|
| 5,554,942 A | | 9/1996 | Herr et al. |
| 5,555,527 A | | 9/1996 | Kotani et al. |
| 5,742,840 A | | 4/1998 | Hansen et al. |
| 5,796,669 A | | 8/1998 | Araki et al. |
| 5,880,998 A | * | 3/1999 | Tanimura et al. ....... 365/189.05 |
| 5,933,623 A | | 8/1999 | Umemura et al. |
| 6,009,036 A | | 12/1999 | Takasugi |
| 6,088,760 A | | 7/2000 | Walker et al. |
| 6,160,423 A | | 12/2000 | Haq |
| 6,167,487 A | | 12/2000 | Comacho et al. |
| 6,226,755 B1 | | 5/2001 | Reeves |
| 6,504,780 B2 | | 1/2003 | Leung |
| 6,570,815 B2 | | 5/2003 | Kashiwazaki |
| 6,615,325 B2 | | 9/2003 | Mailloux et al. |
| 6,665,222 B2 | | 12/2003 | Wright et al. |
| 6,707,743 B2 | | 3/2004 | Leung et al. |
| 6,944,092 B2 | * | 9/2005 | Kang ........................ 365/233 |
| 6,954,384 B2 | * | 10/2005 | Taruishi et al. ......... 365/189.05 |
| 2002/0112114 A1 | | 8/2002 | Blair et al. |
| 2002/0112117 A1 | | 8/2002 | Suh |
| 2002/0133665 A1 | | 9/2002 | Mailloux et al. |
| 2003/0126356 A1 | | 7/2003 | Gustavson |
| 2004/0010637 A1 | | 1/2004 | Johnson |
| 2005/0108469 A1 | | 5/2005 | Freeman et al. |
| 2005/0138267 A1 | | 6/2005 | Bains et al. |
| 2005/0278495 A1 | | 12/2005 | Lee |

OTHER PUBLICATIONS

Pete Vogt, Fully Buffered DIMM (FB-DIMM) Server Memory Architecture: Capacity, Performance, Reliability, and Longevity, Feb. 18, 2004, Intel Developer Forum.

Rami Marwan Nasr, FBSIM and the Fully Buffered DIMM Memory System Architecture, 2005 Thesis—University of Maryland, College Park.

Zhang et al., "A Permutation-based Page Interleaving Scheme to Reduce Row-buffer Conflicts and Exploit Data Locality," IEEE, 2000, pp. 32-41.

Michael et al., "Design and Performance of Directory Caches for Scalable Shared Memory Multiprocessors," IBM Research, Yorktown Heights, NY, 10 pgs.

Yu et al., "DRAM-Page Based Prediction and Prefetching," IEEE, 2000, pp. 267-275.

"Mode Register Definition, Device Operations, DDR SDRAM," Samsung Electronics, 2002. pp. 3, 20 & 22.

XDRTM DRAM System Design Overview, High Performance Memory Interface Solution, RAMBUS XDR, 12 pgs.

"XDR Controller I/O Cell," RAMBUS XDR.

Fully Buffered DIMM (FB-DIMM) Design Considerations, Howard David and Michael McTague, Intel Developer Forum, Feb. 18, 2004. Retrieved from http://www.memforum.org/upload/OSA-S009.pdf, Jan. 5, 2006.

DRAM Module Product Guide. ©Micron 2005. Retrieved from http://download.micron.com/pdf/guide/modguide.pdf Jan. 5, 2006.

DS2100 Serial RAM Chip, data sheet from Maxim/Dallas Semiconductor. Sep. 27, 2002. Retrieved from www.maxim-ic.com/quick_view2.cfm/qv_pk/2627 on Jun. 21, 2006.

* cited by examiner

MEMORY WITH SERIAL INPUT-OUTPUT TERMINALS FOR ADDRESS AND DATA AND METHOD THEREFOR

This application is a Divisional U.S. Ser. No. 10/854,554, filed May 26, 2004, entitled, MEMORY WITH SERIAL INPUT/OUTPUT TERMINALS FOR ADDRESS AND DATA AND METHOD THEREFOR, now granted as U.S. Pat. No. 7,221,613.

CROSS-REFERENCE TO RELATED, COPENDING APPLICATIONS

A related, copending application is entitled "Cache Line Memory and Method Therefor", by Perry H. Pelley, U.S. Ser. No. 10/854,314, assigned to the assignee hereof, and filed on May 26, 2004.

A related, copending application is entitled "Automatic Hidden Refresh in a DRAM and Method Therefor", by Perry H. Pelley, U.S. Ser. No. 10/854,298, assigned to the assignee hereof, and filed on May 26, 2006, now granted as U.S. Pat. No. 7,088,632.

FIELD OF THE INVENTION

This invention relates generally to integrated circuit memories, and more particularly to a dynamic random access memory (DRAM) having a serial data and cache line burst mode.

BACKGROUND

A dynamic random access memory (DRAM) is a well known memory type that depends on a capacitor to store charge representative of two logic states. DRAM integrated circuits are used as, for example, memory modules for personal computers and work stations.

Generally, the trend has been toward fewer memory devices in a system. The memory devices attempt to achieve higher bandwidth to accommodate faster processors by using wider buses, for example, buses that are 32 bits wide. However, clocking wider buses to get higher bandwidth increases power consumption and causes switching noise problems for the system.

Therefore, there is a need for a DRAM that can provide higher bandwidth without increasing power consumption of the memory device and without causing serious problems with noise.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION

Generally, in one embodiment, the present invention provides a memory having a plurality of memory cells, a serial receiver for receiving low voltage high frequency differential address and data signals, and a serial transmitter for transmitting high frequency low voltage differential address and data signals. For the purpose of describing the illustrated embodiment, high frequency for a serial signal means greater than about 2 gigabits per second. Also, the low voltage differential signals have a voltage swing of about 200 to 300 millivolts (mV).

Transmitting and receiving serial address and data signals allows for high speed operation with relatively lower power consumption than a memory that provides parallel address and data signals. Also, the number of pins on a packaged integrated circuit can be greatly reduced.

In another embodiment, the memory can operate in one of two different modes. In normal mode, a DRAM in accordance with the present invention operates similar to any conventional DRAM. In cache line mode, the DRAM uses an extended mode register bit field for controlling a cache line width. The cache line width can be set to write or read an entire cache line in one burst from a single address. A fully hidden refresh mode allows for timely refreshing of the memory cells while operating in cache line mode. A user-programmable bit field is reserved in an extended mode register to store the maximum allowable time period between refresh operations. Data is stored in the memory array by interleaving in multiple banks, or banks of memory cells. During a hidden refresh mode of operation, one half-bank is being accessed while another half-bank is being refreshed. In yet another embodiment, a refresh counter is provided for each bank of memory cells. A Ready/Hold signal is generated based on a comparison of the refresh counters to the clock counter. The Ready/Hold signal is used to signal a processor that data transfer will be stopped to allow a refresh operation when the refresh counters indicate that at least one of the banks of memory cells has reached a critical time period, such that normal refresh must be started to preserve data integrity. The critical time period may be the maximum time remaining in a refresh period. In order to provide better system reliability a BadRxData signal is provided for the case when the information received/transmitted does not pass a parity type check.

In yet another embodiment, two or more of the integrated circuit memories may be chained together to provide a high speed low power memory system.

Figure 1:
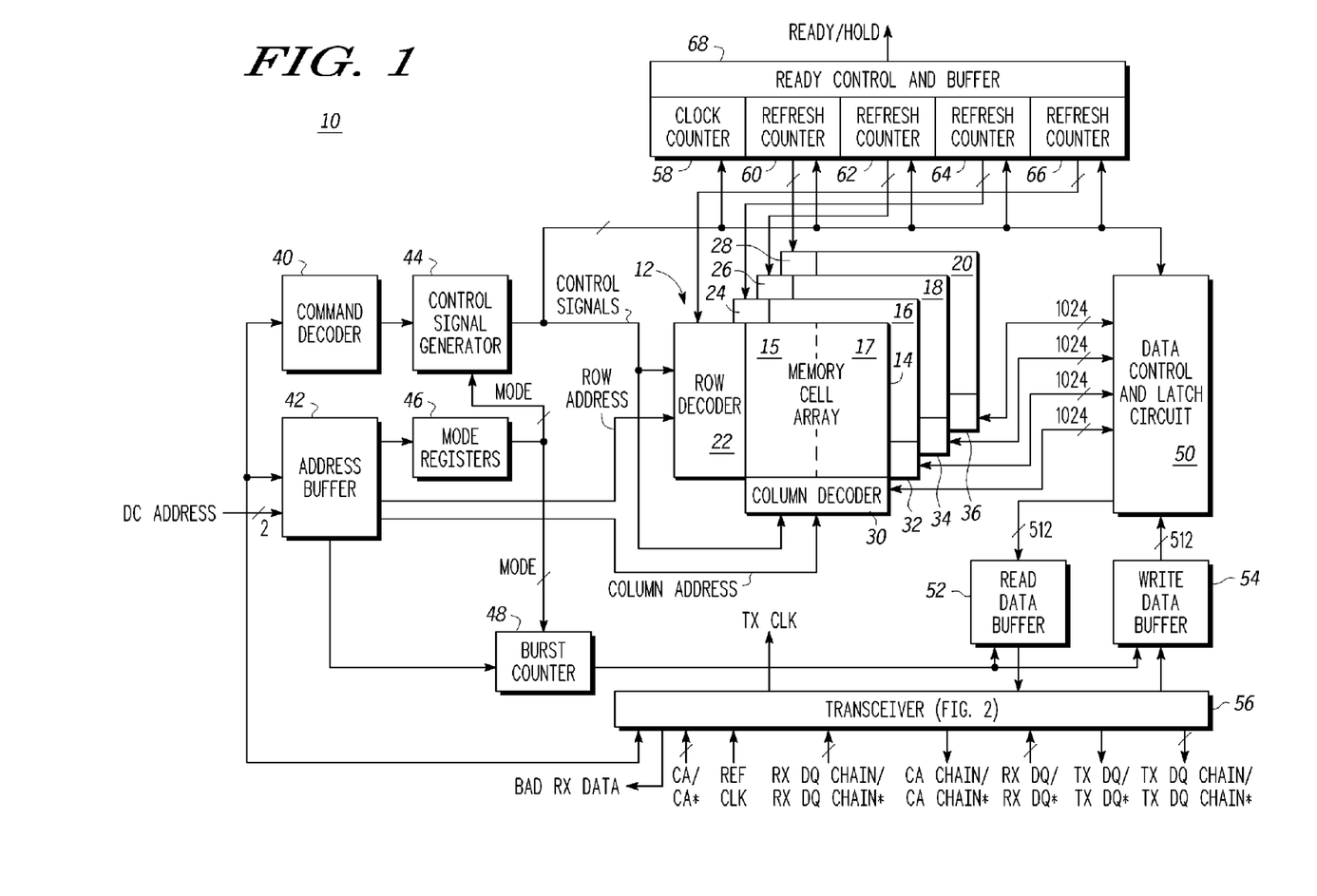
FIG. 1 illustrates, in block diagram form, an integrated circuit memory in accordance with the present invention.

FIG. 1 illustrates, in block diagram form, an integrated circuit memory 10 in accordance with an embodiment of the present invention. Memory 10 includes memory array 12, command decoder 40, address buffer 42, control signal generator 44, mode registers 46, burst counter 48, data control and latch circuit 50, read data buffer 52, write data buffer 54, transceiver 56, clock counter 58, refresh counters 60, 62, 64, and 66, and ready control and buffer 68. Memory array 12 includes memory arrays, or banks, 14, 16, 18, and 20, row decoders 22, 24, 26, and 28, and column decoders 30, 32, 34, and 36.

Memory array 12 is an array of memory cells coupled at the intersections of bit lines and word lines (not shown). The memory cells may be organized in multiple banks of memory cells, such as for example memory banks 14, 16, 18, and 20. Associated with each of the memory banks 14, 16, 18, and 20 are row and column decoders for selecting a memory cell in response to receiving an address. For example, row decoder 22 and column decoder 30 are used to select one or more memory cells in memory bank 14. Note that in the illustrated embodiment, the memory cells are conventional dynamic random access memory (DRAM) cells having a capacitor and an access transistor. The capacitor is for storing charge representative of a stored logic state. The access transistor is for coupling the capacitor to a bit line in response to a selected word line when accessing the memory cell. In other embodiments, memory array 12 may include other memory cell types, that may or may not, require periodic refreshing to maintain a stored logic state.

Figure 4:
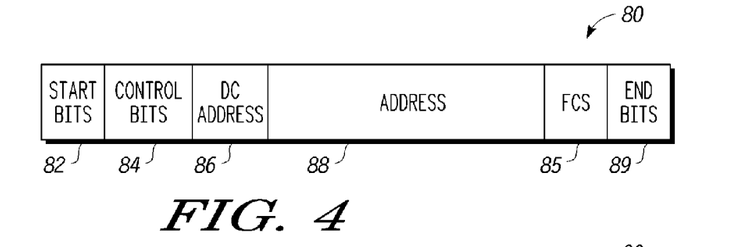
FIG. 4 illustrates, in block diagram form, a serial address packet organization for the memory of FIG. 1.

Address information is provided to memory 10 serially, in the form of packets, using a two-wire high speed (greater than two gigabits per second) low voltage differential (200-300 mV swing) address signal. An address packet includes a header and address bits and other bus protocol portions. An address packet 80 is illustrated in FIG. 4 and will be described later. Differential address signals CA/CA* are provided at input terminals of transceiver 56. Note that an asterisk (*) after a signal name indicates that the signal is a logical complement of a signal having the same name but lacking the asterisk. Transceiver 56 will be described later in more detail. After decoding, incoming address packets transceiver 56 provides address and header information to the address buffer 42 and the command decoder 40. As will also be described later in more detail, command decoder 40 receives header information that includes, for example, read and write instructions and a control bit to determine if memory 10 is to operate in cache line mode or normal mode. The rest of the address packet is provided to address buffer 42. An output terminal of address buffer 42 is coupled to mode registers 46. The header information from the address packet is stored in mode registers 46 and command decoder 40. The address portion is then provided to the row and column decoders conventionally.

An output terminal of mode registers 46 provides a mode signal labeled "MODE" to input terminals of burst counter 48 and control signal generator 44. An output terminal of burst counter 48 is coupled to read data buffer 52 and write data buffer 54. Control signals from control signal generator 44 are provided to inputs of data control and latch circuit 50, row decoders 22, 24, 26, and 28, column decoders 30, 32, 34, and 36, clock counter 58 and refresh counters 60, 62, 64, and 66. The column decoders 30, 32, 34, and 36 are bi-directionally coupled to data control and latch circuit 50. Read buffer 52 has an input coupled to data control and latch circuit 50, and an output coupled to Transceiver 56. Write data buffer 54 has an input coupled to transceiver 56, and an output coupled to data control and latch circuit 50. Transceiver 56 includes terminals for providing/receiving differential data signals labeled "TxDQ/TxDQ*", "RxDQ/RxDQ*", "TxDQ CHAIN/TxDQ CHAIN*", "RxDQ CHAIN/RxDQ CHAIN*", and "CA CHAIN/CA CHAIN*". Also, transceiver 56 receives a reference clock signal labeled "REF CLK" and in response, provides internal clock signals labeled "Tx CLK". To allow the memory system to operate on a single clock domain transceiver 56 uses an elastic buffer that insures that data leaving the receive path crosses over to the transmitter clock domain (Tx CLK), which is the clock domain used by the rest of the memory system. In addition, transceiver 56 provides a signal labeled "BAD Rx DATA" as will be described later.

Memory 10 is pipelined and its operation is timed using high speed differential clock signals. Clock counter 58 is an access cycle counter and has an input for receiving Tx CLK and an output coupled to ready control and buffer 68. Each row decoder 22, 24, 26, and 28 is coupled to a refresh counter 66, 64, 62, and 60, respectively to receive refresh addresses. In addition, each of the refresh counters 60, 62, 64, and 66 receive a control signal from control signal generator 44 to indicate when the memory cell arrays 14, 16, 18, and 20 are to be refreshed. Ready control and buffer circuit 68 is coupled to receive the values from clock counter 58 and each of refresh counters 60, 62, 64, and 66. In response, ready control circuit 68 outputs a control signal labeled "READY/HOLD" to a processor (not shown). Note that a processor coupled to memory 10 will be configured with registers for storing mode register control bits for configuring memory 10.

In operation, differential address signals CA/CA* are provided serially to two-wire input terminals of the transceiver 56. Transceiver 56 decodes and parallelizes packet 80 (FIG. 4) containing the address and control data. If an error is detected in packet 80 the BadRxData signal is asserted to alert the processor to resend the address. After decoding and parallelization by the transceiver the header and address information is provided to the inputs of command decoder 40 and address buffer 42. Differential data signals RxDQ/RxDQ* are provided to, and TxDQ/TxDQ* are provided by Transceiver 56 depending on whether the access is a read access or write access as determined by the control bits 84 of address packet 80. For writing data a packet 90 (FIG. 5) is received, decoded, and parallelized. Decoding and parallelization occur in a similar way as the way the address packet is processed. Data received from the array 12 is encoded and FCS (frame check sequence) bits are calculated by the transceiver 56. The resulting packet is driven onto the TxDQ outputs. Alternatively, the serial address and data packets can be provided or received on the same two-wire terminals as RxDQ/RxDQ*, optionally eliminating the need for four pins (CA/CA* and CA CHAIN/CA CHAIN*) on a packaged memory device including memory 10. In one embodiment, this configuration can be achieved by assigning a register bit in mode registers 46 to reconfigure the serial address or serial data to a multiplexed serial differential address and data. Data and address packets would be provided to the two-wire terminal on a time slot basis. This configuration would allow the address buses associated with CA/CA* and CA CHAIN/CA CHAIN* to be powered down. This multiplexing of address and data would reduce power at the expense of additional latency. A DC ADDRESS is provided to a second input terminal of address buffer 42. When multiple integrated circuit memories 10 are chained together in a memory module, the DC ADDRESS is used to identify which memory integrated circuit is being accessed, and to enable the memory for an access, as described later in the discussion of FIG. 6. One bit of the address signal header information determines if the memory is to operate in normal mode or cache line mode. In another embodiment a bit in a mode register determines if the memory is to operate in a cache line mode or a normal mode.

When memory 10 operates in cache line mode, a single address is used to read or write an entire cache line through the serial DQ terminals, or pins. When memory 10 operates in normal mode, a single address is used to access one location and begin an access with conventional burst lengths, for example an eight bit or 16 bit burst. For serial operation longer bursts are more efficient. The burst length for a cache line and the normal burst length are selected by setting control bits in header control bits 84 of FIG. 4. The serial address signals CA/CA* are passed from address buffer to mode registers 46 during mode register set up. Mode registers 46 are set in response to control bits 84 from the address packet and op-codes supplied in the place of address information, including the bit for selecting the cache line burst length. In one embodiment, the length of a cache line is set in extended mode register 70 (FIG. 3) of mode registers 46. Extended mode register 70 will be described in more detail below. A mode signal MODE is provided to set the number of bits in burst counter 48. Also, the MODE signal is provided to control signal generator 44. Control signal generator 44 provides signals CONTROL SIGNALS to control the operation of row decoders 22, 24, 26, and 28, column decoders 30, 32, 34, and 36, refresh counters 60, 62, 64, and 66, clock counter 58, and data control and latch circuit 50 based on the MODE signal. Address buffer 42 supplies address signals ROW ADDRESS and COLUMN ADDRESS. The ROW ADDRESS signals and COLUMN ADDRESS signals select a location in memory cell arrays 12 to begin either a cache line burst or a normal burst depending on the operating mode.

During a cache line burst, the burst data is interleaved between two memory sub-banks of the selected bank, for example, two equal portions, or array halves 15 and 17 of memory cell bank 14. The data is interleaved within the selected bank to allow refresh operations in the array half that is not being accessed while data is being burst. For example, if a cache line is being burst from array 14 in a cache line read operation, the data read to fill the cache line is alternately burst from the sub-banks 15 and 17 of bank 14. Specifically, in the case of a 256 bit cache line burst, 128 bits are burst from sub-array 15 and 128 bits are burst from sub-array 17. The data is provided out of the memory arrays 12 through data control and latch circuit 50. Data control and latch circuit 50 provides timing and further address decoding before providing the data to read data buffer 52. Read data buffer 52 provides the data to transceiver 56. After encoding and serializing the data, transceiver 56 provides serial differential data packets for outputting from memory 10. Likewise, transceiver 56 processes incoming data and passes the parallelized data to write data buffer 54. Data packets are input or output serially through transceiver 56 using the format illustrated in FIG. 5.

Memory 10 provides the option of using a fully automatic hidden refresh or a conventional refresh. One bit of the extended mode register is used to choose if the automatic hidden refresh option is enabled during cache line mode. Alternatively normal refresh modes are used. In the illustrated embodiment, hidden refresh is only available as an option when memory 10 is in cache line mode. In hidden refresh mode, one or more banks, of memory cells are refreshed while a cache line burst is occurring in another bank. In addition, refresh can be achieved on the half bank not currently being read or written. The use of bank halves reduces or eliminates the possibility of data patterns where a bank cannot be refreshed. In other modes where some or all other banks are unused, hidden refresh can continue unhindered. In other words, hidden refresh is achieved by refreshing one bank half while reading or writing the other bank half.

Figure 3:
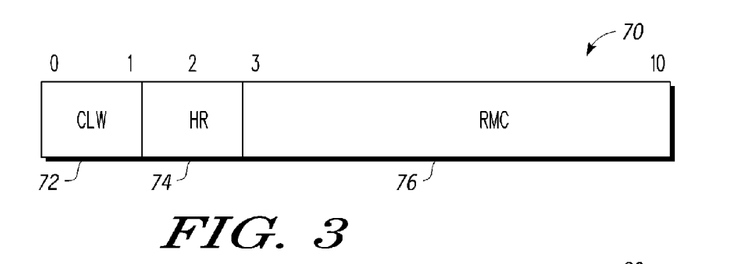
FIG. 3 illustrates, in block diagram form, a mode register of the memory of FIG. 1.

In a DRAM, charge leakage from a memory cell capacitor, as well as FET (field-effect transistor) junction leakage varies with temperature. Therefore, as temperature increases, the memory cells will need to be refreshed more often. The refresh rate of memory 10 can be changed from the manufacturer's specified refresh rate by setting a maximum number of clocks for a full refresh in bit field 76 labeled RMC (refresh maximum clocks) of extended mode register 70. The value to set in bit field 76 may be determined, for example, by a graph showing refresh rate versus temperature and voltage. A memory manufacturer would need to provide the graph to allow the refresh rate to be adjusted.

A processor associated with memory 10 will register the maximum number of clock cycles for a full refresh and transfer the information to the memory upon setup of the extended mode register. This provides the advantage of refreshing the memory at an optimum refresh rate for a particular temperature and voltage. Also, this allows the memory to be refreshed only as frequently as necessary to provide reliable data storage for a particular temperature. In addition, fewer refresh cycles will lower power consumption of the memory as compared to a memory that uses a fixed higher refresh rate based on worst case temperature, voltage, and process variations for parts binned according to maximum refresh time.

A ready/hold signal labeled "READY/HOLD" is optionally provided to stop a processor read/write to allow a normal self refresh if data management is poor and refresh rates are marginal. The refresh operations for each bank counted in refresh counters 60, 62, 64, and 66 corresponding to banks 20, 18, 16, and 14 of memory array 12. For example, memory cell array 14 is coupled to refresh counter 66 via row decoder 22. Refresh counters 60, 62, 64, and 66 count the number of refresh operations and supply refresh addresses to their respective memory cell arrays 20, 18, 16, and 14. The word line counters are initialized at the maximum address in the bank and count down to the lowest address. The clock counter is initialized to the RMC value. The values in refresh counters 60, 62, 64, and 66 are compared to the value of clock counter 58 using a comparator in ready control and buffer 68. The number of cycles remaining for completion of a refresh update operation in each bank is compared to the number of clocks remaining in clock counter 58 that needed to complete refresh for control of the READY/HOLD signal. If the count value of any of refresh counters 60, 62, 64, and 66 remaining to finish refresh equals or optionally approaches the clock number of counts on the counter initialized by the RMC value stored in bit field 76, then the READY/HOLD signal is asserted, thus stopping a processor read or write operation to allow refresh operations to complete before the count of the clock counter 58 is completed. Clock counter 58 and refresh counters are all reset to starting condition at the completion of a clock count.

Figure 2:
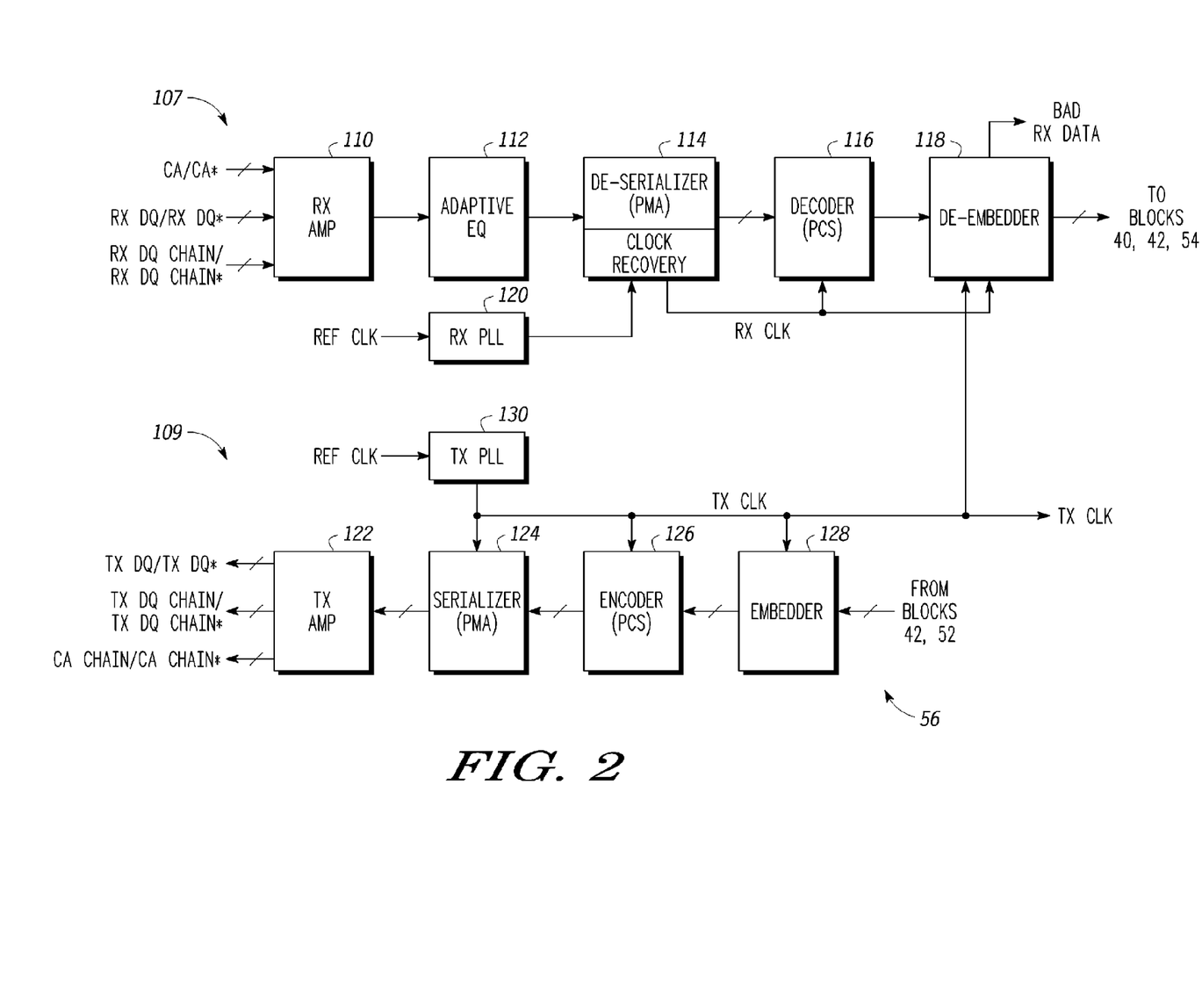
FIG. 2 illustrates, in block diagram form, the transceiver of FIG. 1.

FIG. 2 illustrates, in block diagram form, a transceiver 56 of the memory of FIG. 1. Transceiver 56 includes a receive path 107 and a transmit path 109. Receive path 107 includes receiver amplifier 110, adaptive equalizer 112, de-serializer and clock recovery 114, decoder 116, de-embedder 118, and receiver phase-locked loop (PLL) 120. Transmit path 109 includes transmitter amplifier 122, serializer 124, encoder 126, embedder 128, and transmitter PLL 130.

The use of serial interconnects provide an advantage of a integrated circuit having a relatively low pin count. Also, the use of serial interconnects can provide an integrated circuit with relatively lower power consumption than an integrated circuit with parallel interconnects. However, the use of serial high speed data links, or interconnects, requires at least some signal processing and overhead in order to insure reliable transmission of data. In accordance with one embodiment, a source synchronous high speed serial link is defined at the physical layer interface, that is, an electrical interface and memory-to-memory controller link protocol. The serial link uses packets, in-band control symbols and encoded data to provide information to the receiving link partner. The information may include, for example, the beginning and end bits of a packet, certain control symbols, cyclic redundancy check, memory addresses and memory data. Using the Open System Interface (OSI) terminology, the link uses a Physical Coding Sublayer (PCS) and a Physical Media Attachment (PMA) sublayer to place the packets in a serial bit stream at the transmitting end of the link and for extracting the bit stream at the receiving end of the link. The PCS uses data encoding to encode and decode data for transmission and for reception over the link. One example of transmission coding is the 8b/10b coder/decoder defined in the Fibre Channel (X3.230) and Gigabit Ethernet (IEEE 802.3z) in which each byte of data is converted to a 10 bit DC balanced stream (equal number of 1's and 0's) and with a maximum number of consecutive 1's or 0's of five. A redundancy of codes is used to insure that each of the 10 bit steams has "sufficient" signal transition to allow clock recovery and to have codes with six 1's and four 0's to be followed by a code with six 0's and four 1's and vice-versa. For this reason each 8 bit group has two 10 bit code-groups that represent it. One of the 10 bit code groups is used to balance a "running disparity" with more 1's than 0's and the other is used when the running disparity has more 0's than 1's. A selected few of the remaining 10 bit code-groups are used as control/command codes and the rest will be detected as invalid codes which, if detected, should indicate a transmission error. Special 7 bit patterns within the 10 bit code-group (0011111XXX and 1100000XXX) called comma characters, only occur in a few command codes, and are used to enable clock synchronization and word alignment. The PCS could also be used for adding an idle sequence, symbol alignment on the encoding side and reconstruction of data and word alignment on the receiving side. The PMA sublayer does the serializing and de-serializing of the 10-bit code-groups. The PMA sublayer could also be responsible for clock recovery and for alignment of the received bit stream to 10-bit code-group boundaries.

The memory system in accordance with the present invention uses differential current steering drivers similar to those used in other high speed serial interfaces like IEEE 802.3 XAUI defined interface and 10 gigabits per second Ethernet interface. Since the interface in accordance with one embodiment of the present invention is primarily intended for chip-to-chip connections, a low peak-to-peak voltage swing is used so that the overall power used by the transceiver 56 is relatively low.

Figure 5:
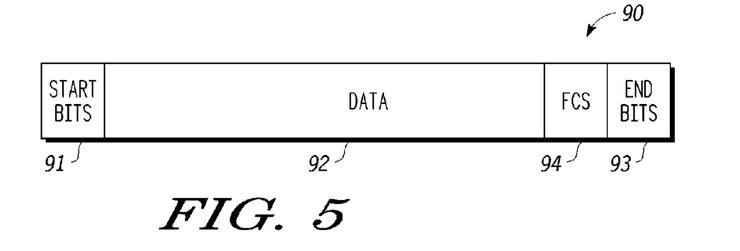
FIG. 5 illustrates, in block diagram form, a serial data packet organization for the memory of FIG. 1.

Transceiver 56 includes a receive path 107 for receiving and decoding the address, data and control symbols coming from the physical media and a transmit path 109 for encoding and transmitting address, data, and control symbols to the physical media. Receive path 107 uses AC coupling to ensure interoperability between drivers and receivers that use different physical configurations and/or different technologies. Receiver amplifier 110 senses the differential signal across an on-chip source termination impedance. The output of receive amplifier 110 is provided to adaptive equalizer 112. Adaptive equalizer 112 compensates for distortions to the received signal caused by the physical media. Following equalization a clock recovery block of de-serializer and clock recovery114 takes the serial data and uses the data transitions to generate a clock. A timing reference (a phase-locked loop for example) takes reference clock REF CLK of lower frequency and generates a higher frequency clock Rx CLK of a frequency determined by the received signal transitions. The receiver recovered clock RxCLK can then be used as the timing reference for the remaining function in receive path 107. The output of adaptive equalizer 112 is provided to de-serializer and clock recovery 114. This block performs the serial-to-parallel conversion of the received signal. At this point the receiver signal is still encoded. Decoder 116 performs the decoding of the signal. In the case of an 8b/10b coded signal, each 10 bit code-group leaving de-serializer 114 is decoded to a 8 bit data code-group (memory address or memory data) or a control symbol. Decoder 116 has a pattern detector that searches for common patterns across the received stream and uses this to synchronize the data stream word boundaries with the clock signal Rx CLK. The address, data, and control symbol word is provided to de-embedder 1118. De-embedder 118 uses an elastic buffer to allow communication from the receiver clock domain to the memory clock domain (Tx CLK). De-embedder 118 generates the appropriate control response and groups the data and address into the desired bus widths. These signals then leave transceiver 56 to the write data buffer 54, command decoder buffer 40 and address buffer 42. When invalid codes are detected or if a frame check sequence error is detected, a transceiver BadRxData signal is activated, alerting the sending processor to resend the data. The frame check sequence (FCS), illustrated in FIG. 4 and FIG. 5, is a field in the packet that uses a cyclic redundancy checksum (CRC) to detect errors in transmission. The checksum is generated using a mathematical algorithm and appended to the packet. The value of the CRC is based on the content of the message. Receiver 56 recalculates the CRC of the received packet and compares it to the appended CRC. If the values match the message is assumed to be error-free.

Transmitter path 109 of transceiver 56 has its own clock generator block 130. Transmitter PLL 130 is essentially a clock multiplier that takes the reference clock REF CLK and generates a clock signal Tx CLK of much higher frequency rate. The transmitter clock Tx CLK can then be used as the timing reference for the remaining functions in the transmit path and by the remaining blocks in memory 10. The address, data and control symbol word embedder 128 receives its inputs from the address buffer 42, the read data buffer 52, the command decoder buffer 40 and receives the control information from the packet. Encoder 126 encodes the stream to be transmitted in to the appropriate coding method used and includes the encoding of a CRC to allow determination of the accuracy to the packet when received. In the case of a 8b/10b encoder, encoder 126 will encode each group of 8-bit groups into the appropriate 10-bit code-groups maintaining the running disparity that insures DC balance. The output of the encoder is provided to serializer 124. Serializer 124 performs a parallel-to-serial conversion of the transmit data stream. This serialized data stream is then provided to transmitter amplifier 122. In one embodiment, transmitter amplifier 122 can be implemented as a differential current steering driver.

FIG. 3 illustrates, in block diagram form, an extended mode register 10 of mode registers 46 of memory 10 of FIG. 1. Extended mode register 10 has a bit field 72 labeled "CLW" (Cache Line Width) for selecting the cache line width mode of operation and to select the width of the data to be read from, or written to, memory 10 during a single burst. By way of example, in the illustrated embodiment, two bits are used to select one of three different widths. A value of [0, 0] in bit field 72 may indicate that the cache line mode is selected and has a burst length of 128 bits. Also, a value of [0, 1] in bit field 72 may indicate that the cache line mode is selected and has a burst length of 256 bits. Likewise, a value of [1, 0] in bit field 72 may indicate that the cache line mode is selected and has a burst length of 512 bits. To use memory 10 in normal mode, bit field 72 may have a value of [1,1]. One skilled in the art will readily recognize that bit field 72 may include a different number of bits for allowing more or fewer cache line widths, and the particular cache line widths to be selected can be different. Also, the bits may be used in a different combination to select the illustrated widths. For example, [0, 0] may be used instead of [1, 1] to indicate that the memory is to operate in normal mode instead of cache line mode. Additional bits could be used to provide more options.

Bit field 74 is an optional bit field and includes one bit for selecting between the fully hidden refresh mode and a conventional refresh mode. In another embodiment, the hidden refresh mode may be selected by including a hidden refresh control bit in the control bits of bit field 84 in FIG. 4. The fully hidden refresh mode can only be used during cache line mode, but the conventional refresh mode can be used during cache line mode and normal mode.

In the illustrated embodiment, bit field 76 includes eight bits for storing the RMC (refresh maximum clocks). The RMC is used during the hidden refresh mode to define a refresh period. All of the memory cells must be refreshed before the number of RMC counts stored in bit field 76 is reached. If the ambient temperature under which the memory is expected to operate is to be relatively low, or the operating voltage is below the specified maximum voltage, the refresh rate can be longer than the refresh rate defined by the manufacturer's specification for the memory, often by more than an order of magnitude. Decreasing the refresh rate can reduce power consumption for battery powered applications.

Figure 6:
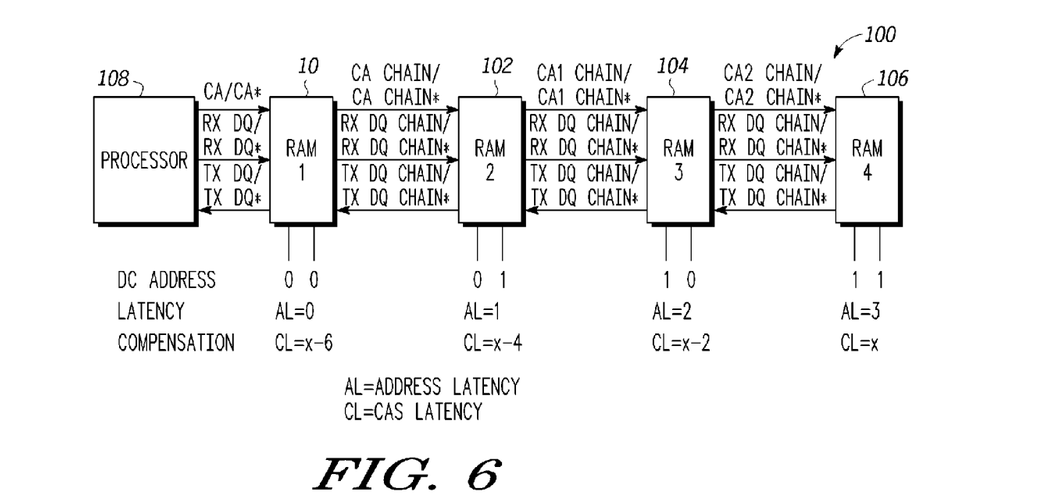
FIG. 6 illustrates, in block diagram form, a memory system having the memory of FIG. 1.

FIG. 4 illustrates, in block diagram form, a serial address packet 80 for the memory of FIG. 1. The serial address packet 80 is provided to memory 10 by a processor as low voltage differential signals CA/CA*. In address packet 80, a bit field 82 includes bits for defining the start of a packet. Bit field 84 includes a plurality of control bits for setting up memory operation. For example, one bit may be used to determine whether the memory is to be accessed for a read or write. Also, one bit may be used for bit HR to determine if the automatic hidden refresh mode described above is to be used. Bit field 86 includes two bits labeled "DC address" for addressing which memory is being accessed when more than one memory is chained together as illustrated in FIG. 6. In the illustrated embodiment, two bits in bit field 86 allow up to four integrated circuit memories to be chained for use in, for example, a memory module for a personal computer. Including additional bits in bit field 86 will allow more than four integrated circuit memories to be chained together in other embodiments. For example, three bits will allow up to eight integrated circuit memories to be chained together. Bit field 85 is for storing the FCS bits as described above. Bit field 88 is for storing the address to be accessed in the memory selected by bit field 86. The number of bits in bit field 88 is dependent on the number of memory cells and the organization of the memory. Bit field 89 includes "End Bits" for indicating the end of an address packet.

FIG. 5 illustrates, in block diagram form, a serial data packet 90 for the memory of FIG. 1. Data packet 90 is transmitted to memory 10 as low voltage differential signals RxDQ/RxDQ* concurrently with address packet 80. In data packet 90, bit field 91 includes bits for indicating the beginning of the data packet. Bit field 92 includes either read data or write data, depending on whether the memory operation is to be a read or a write. The number of data bits included in bit field 92 can be any number. In one embodiment, the number of data bits is equal to the cache line width. Bit field 93 includes the end bits of the date packet. Bit field 94 includes the FCS bits as described above in the discussion of FIG. 2.

FIG. 6 illustrates, in block diagram form, a memory system 100 implemented with the memory of FIG. 1. Memory system 100 is coupled to a processor 108 and includes memories 10, 102, 104, and 106. Each of memories 102, 104, and 106 are similar to memory 10 as illustrated in FIGS. 1-5 and described above. In memory system 100, memory 10 has an input for receiving differential address signals CA/CA* from processor 108, and bidirectional terminals for transmitting differential data signals TxDQ/TxDQ* and RxDQ/RxDQ* between processor 108 and memory system 100. Also, memory 10 has an output for providing differential address signals CA CHAIN/CA CHAIN* to an address input of memory 102, and terminals for transmitting differential data signals TxDQ CHAIN/TxDQ CHAIN* between memory 10 and terminals of memory 102. Memory 102 has an output for providing differential address signals CA1 CHAIN/CA1 CHAIN* to an address input of memory 104, and terminals for communicating data signals TxDQ1 CHAIN/TxDQ1 CHAIN* and RxDQ1 CHAIN/RxDQ1 CHAIN*to and from the data of terminals of memory 104. Likewise, memory 104 communicates address signals CA2 CHAIN/CA2 CHAIN* to an address input of memory 106 and communications data signals TxDQ2 CHAIN/TxDQ2 CHAIN* and RxDQ2 CHAIN/RxDQ2 CHAIN* between bidirectional terminals of memories 104 and 106.

When receiving address and data and when transmitting the data to the next memory in the chain, the chained memories do not necessarily use all of the functions provided in the Receive path and the transmit path. For example, a serial address received at CA/CA* may go through the receiver amplifier 110 and use adaptive equalizer 112 and then directly to transmitter amplifier 122 and out to CA CHAIN/CA CHAIN*. The function of the transmitter amplifier is done using the receiver clocks. Likewise, RxDQ/RXDQ* may be received and re-transmitted through RxDQ CHAIN/RxDQ CHAIN* via adaptive equalizer 112 to transmitter amplifier 122. As illustrated in FIG. 6, Address latency labeled LATENCY (AL) and CAS (Column Address Strobe) latency labeled CAS LATENCY (CL) are adjusted for each of the memories based on position in the chain as indicated in the row labeled "COMPENSATION". Thus, FIG. 6 shows the exemplary values of ADDRESS LATENCY AND CAS LATENCY, for RAM 1, AL=0 and CL=x-6; for RAM 2, ADDRESS LATENCY AL=1 and CL=x-4, for RAM 3, AL=2 and CL=x-2, and for RAM 4, AL=3 and CL=x, where x is a variable indicating relative latency and is based on the number of memories in the chain, for example it would have a value of 8 for the exemplary chain shown in FIG. 6.

Each of memories 10, 102, 104, and 106 has two inputs for receiving two-bit chip address signal DC ADDRESS. As illustrated in FIG. 6, the value of the two-bit address is unique for each memory of memory system 100. For example, memory 10 is assigned a DC ADDRESS of [0, 0], memory 102 is assigned DC ADDRESS [0, 1], memory 104 is assigned DC ADDRESS [1, 0], and memory 106 is assigned DC ADDRESS [1, 1]. By way of example, when address packet 80 is communicated from processor 108 with [1, 0] in bit field 86, memory 104 is accessed to receive the address from bit field 88 (see FIG. 4). Address packet 80 is provided in the form of a plurality of serial differential signals CA/CA* to differential address input terminals of memory 10. Address packet 80 is provided to address buffer 42 where it then exits memory 10 as differential signals CA CHAIN/CA CHAIN* and is provided to address input terminals of memory 102. The address packet is provided to each of the other memories in like manner. In response to the address packet, memory 104 will provide a data packet 90 to processor 108 during a read operation, or receive data packet 90 from processor 108 during a write operation. For example, if the memory access is a read operation from memory 104, the data packet will be provided to processor 108 via memories 102 and 10. Because the serial address and data signals are being clocked at very high speeds, such as for example, over 2 gigabits per second, the data can be provided very rapidly with lower power consumption than a comparable conventional DRAM.

Processor 108 must contain registers and an interface that is similar to the registers and interfaces of memories 10, 102, 104, and 106 in order to be able to initialize memory 10, 102, 104, and 106 and to properly drive the buses shared with memory 10, 102, 104, and 106.

Various changes and modifications to the embodiments herein chosen for purposes of illustration will readily occur to those skilled in the art. To the extent that such modifications and variations do not depart from the scope of the invention, they are intended to be included within the scope thereof, which is assessed only by a fair interpretation of the following claims.

What is claimed is:

1. A memory, on an integrated circuit, comprising:
   an array of addressable memory cells;
   a plurality of serial address input terminals of a transceiver on the integrated circuit for receiving a plurality of low voltage differential serial address input signals for accessing a memory cell of the memory array; and
   a plurality of serial data input/output terminals of the transceiver on the integrated circuit for receiving or providing a plurality of low voltage differential serial data input/output signals based on the plurality of differential serial address input signals.

2. The memory of claim 1, wherein said memory is a dynamic random access memory (DRAM).

3. The memory of claim 1, wherein at least one of said plurality of low voltage differential serial data input/output signals, and said plurality of low voltage differential address input signals are provided at a data rate of at least 2 gigabits per second.

4. The memory of claim 1, further comprising a clock buffer coupled to the memory for receiving a reference clock signal.

5. The memory of claim 1, wherein said plurality of low voltage differential serial address input signals has a voltage within a range of about 200 millivolts to about 300 millivolts and said plurality of low voltage differential data input/output signals has a voltage within a range of about 200 millivolts to about 300 millivolts.

6. The memory of claim 1, further comprising a phase-locked loop (PLL), the PLL being locked to predetermined bits of the plurality of low voltage differential data input/output signals to generate a clock signal for timing operation of the memory.

7. The memory of claim 1, wherein the plurality of low voltage differential serial address input signals are provided to the memory in the form of packets, each of the packets having a start bit, address bits, an end bit, and one or more control bits.

8. The memory of claim 1, wherein the plurality of serial data input/output terminals of the transceiver on the integrated circuit are adapted to be configured as a multiplexed serial bus terminal for transmitting both serial data signals and serial address signals on a time slotted basis by setting a control register bit.

9. The memory of claim 1, wherein the plurality of serial data input/output terminals of the transceiver on the integrated circuit are configured to receive a first address signal multiplexed with a second data signal.

10. The memory of claim 1, wherein the transceiver comprises a receive path and a transmit path.

11. The memory of claim 10, wherein the receive path comprises a phase locked loop (PLL), a de-serializer, and a clock-recovery circuit.

12. The memory of claim 11, wherein the receive path further comprises an amplifier, an equalizer, and a decoder.

13. The memory of claim 10, wherein the transmit path comprises a serializer and a phase locked loop (PLL).

14. The memory of claim 13, wherein the transmit path comprises an encoder.

15. A memory, on an integrated circuit, comprising:
   a memory array;
   a plurality of serial address input terminals of a transceiver on the integrated circuit for receiving a plurality of low voltage differential serial address input signals for accessing a memory cell of the memory array; and
   a plurality of serial data input/output terminals of the transceiver on the integrated circuit for receiving or providing a plurality of low voltage differential serial data input/output signals based on the plurality of differential serial address input signals, wherein the transceiver comprises a phase-locked loop (PLL), the PLL being locked to predetermined bits of the plurality of low voltage differential data input/output signals to generate a clock signal for timing operation of the memory and wherein the transceiver further comprises a transmit path and a receive path and wherein the transmit path comprises a serializer and wherein the receive path comprises a de-serializer.

16. The memory of claim 15, wherein said memory is a dynamic random access memory (DRAM).

17. The memory of claim 15, wherein at least one of said plurality of low voltage differential serial data input/output signals, and said plurality of low voltage differential address input signals are provided at a data rate of at least 2 gigabits per second.

18. The memory of claim 15, further comprising a clock buffer coupled to the memory for receiving a reference clock signal.

19. The memory of claim 15, wherein said plurality of low voltage differential serial address input signals has a voltage within a range of about 200 millivolts to about 300 millivolts and said plurality of low voltage differential data input/output signals has a voltage within a range of about 200 millivolts to about 300 millivolts.

20. The memory of claim 15, wherein the plurality of low voltage differential serial address input signals are provided to the memory in the form of packets, each of the packets having a start bit, address bits, an end bit, and one or more control bits.

21. The memory of claim 15, wherein the plurality of serial data input/output terminals of the transceiver on the integrated circuit are adapted to be configured as a multiplexed serial bus terminal for transmitting both serial data signals and serial address signals on a time slotted basis by setting a control register bit.

22. The memory of claim 15, wherein the plurality of serial data input/output terminals of the transceiver on the integrated circuit are configured to receive a first address signal multiplexed with a second data signal.

23. A memory, on an integrated circuit, comprising:
   a memory array;
   a plurality of serial address input terminals of a transceiver on the integrated circuit for receiving a plurality of low voltage differential serial address input signals for accessing a memory cell of the memory array; and
   a plurality of serial data input/output terminals of the transceiver on the integrated circuit for receiving or providing a plurality of low voltage differential serial data input/output signals based on the plurality of differential serial address input signals, wherein the transceiver comprises a phase-locked loop (PLL), the PLL being locked to predetermined bits of the plurality of low voltage differential data input/output signals to generate a clock signal for timing operation of the memory and wherein the transceiver further comprises a transmit path and a receive path and wherein the transmit path comprises a serializer and wherein the receive path comprises a de-serializer, an equalizer, and a decoder.

* * * * *